United States Patent
Arai (10) Patent No.: US 10,340,378 B1
(45) Date of Patent: Jul. 2, 2019

(54) SEMICONDUCTOR DEVICE (71) Applicants: Kabushiki Kaisha Toshiba, Minato-ku (JP); Toshiba Electronic Devices & Storage Corporation, Minato-ku (JP)

(72) Inventor: Masatoshi Arai, Hakusan (JP)

(73) Assignees: Kabushiki Kaisha Toshiba, Minato-ku (JP); Toshiba Electronic Devices & Storage Corporation, Minato-ku (JP)

( * ) Notice: Subject to any disclaimer, the term of this patent is extended or adjusted under 35 U.S.C. 154(b) by 0 days.

(21) Appl. No.: 16/012,339

(22) Filed: Jun. 19, 2018

(30) Foreign Application Priority Data

Feb. 20, 2018 (JP) ................. 2018-027858

(51) Int. Cl.
H01L 29/78 (2006.01)
H01L 29/417 (2006.01)
H01L 29/423 (2006.01)

(52) U.S. Cl.
CPC .... *H01L 29/7813* (2013.01); *H01L 29/41741* (2013.01); *H01L 29/4236* (2013.01); *H01L 29/7809* (2013.01); *H01L 29/7811* (2013.01); *H01L 29/7825* (2013.01)

(58) Field of Classification Search
CPC ............. H01L 29/4236; H01L 29/7825; H01L 29/7813
USPC ........................................................ 257/278
See application file for complete search history.

(56) References Cited

U.S. PATENT DOCUMENTS

| 2008/0237852 | A1 | 10/2008 | Yoshida et al. | |
| 2012/0217555 | A1* | 8/2012 | Saito | H01L 29/1095 257/288 |
| 2012/0298994 | A1* | 11/2012 | Sawada | H01L 29/42372 257/48 |
| 2014/0284709 | A1* | 9/2014 | Shimomura | H01L 29/7827 257/330 |
| 2015/0325691 | A1* | 11/2015 | Miyakoshi | H01L 29/42372 257/329 |

(Continued)

FOREIGN PATENT DOCUMENTS

| JP | 2002-203964 | 7/2002 |
| JP | 2008-251923 | 10/2008 |
| JP | 2012-216577 | 11/2012 |

*Primary Examiner* — David Vu
*Assistant Examiner* — Brandon C Fox
(74) *Attorney, Agent, or Firm* — Oblon, McClelland, Maier & Neustadt, L.L.P.

(57) ABSTRACT

According to one embodiment, a semiconductor device includes a first electrode, a first semiconductor region of a first conductivity type, a second semiconductor region of a second conductivity type, a third semiconductor region of the first conductivity type, a gate electrode, a fourth semiconductor region of the second conductivity type, an interconnect portion, and a second electrode. The gate electrode includes a first portion, a second portion, and a third portion between the first portion and the second portion. The first portion opposes the first to third semiconductor regions. The second portion is separated from the first portion. The fourth semiconductor region includes a first region opposing the second portion. The interconnect portion is electrically connected to the third portion. The second electrode is provided on the second and third semiconductor regions and the first region. The second electrode is electrically connected to the second to fourth semiconductor regions.

9 Claims, 11 Drawing Sheets

(56) References Cited

U.S. PATENT DOCUMENTS

2018/0240867 A1\* 8/2018 Nitta .................. H01L 29/0623

\* cited by examiner

SEMICONDUCTOR DEVICE

CROSS-REFERENCE TO RELATED APPLICATIONS

This application is based upon and claims the benefit of priority from Japanese Patent Application No. 2018-027858, filed on Feb. 20, 2018; the entire contents of which are incorporated herein by reference.

FIELD

Embodiments described herein relate generally to a semiconductor device.

BACKGROUND

A semiconductor device such as a MOSFET (Metal Oxide Semiconductor Field Effect Transistor) or the like is used in, for example, power conversion. It is undesirable for shorts to occur easily between the gate electrode and the semiconductor regions of the semiconductor device.

DETAILED DESCRIPTION

According to one embodiment, a semiconductor device includes a first electrode, a first semiconductor region of a first conductivity type, a second semiconductor region of a second conductivity type, a third semiconductor region of the first conductivity type, a gate electrode, a fourth semiconductor region of the second conductivity type, an interconnect portion, and a second electrode. The first semiconductor region is provided on the first electrode and electrically connected to the first electrode. The second semiconductor region is provided on the first semiconductor region. The third semiconductor region is provided on a portion of the second semiconductor region. The gate electrode is provided on the first semiconductor region. The gate electrode includes a first portion, a second portion, and a third portion. The first portion opposes, in a second direction with a gate insulating portion interposed, the second semiconductor region, a portion of the first semiconductor region, and at least a portion of the third semiconductor region. The second direction is perpendicular to a first direction. The first direction is from the first semiconductor region toward the second semiconductor region. The second portion is separated from the first portion in a third direction. The third direction is perpendicular to the first direction and the second direction. The third portion is positioned between the first portion and the second portion. The fourth semiconductor region includes a first region. The first region opposes the second portion in the second direction with the gate insulating portion interposed. The interconnect portion is provided on the third portion and electrically connected to the third portion. The second electrode is provided on the second semiconductor region, the third semiconductor region, and the first region. The second electrode is electrically connected to the second semiconductor region, the third semiconductor region, and the fourth semiconductor region and electrically isolated from the interconnect portion.

Embodiments of the invention will now be described with reference to the drawings.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

In the drawings and the specification of the application, components similar to those described thereinabove are marked with like reference numerals, and a detailed description is omitted as appropriate.

In the following descriptions and drawings, notations of $n^+$, $n^-$ and $p^+$, $p^-$ represent relative height of an impurity concentration in conductive types. That is, the notation with "+" shows a relatively higher impurity concentration than an impurity concentration for the notation without any of "+" and "−". The notation with "−" shows a relatively lower impurity concentration than the impurity concentration for the notation without any of them. These notations represent relative height of a net impurity concentration after mutual compensation of these impurities when respective regions include both of a p-type impurity and an n-type impurity.

The embodiments described below may be implemented by reversing the p-type and the n-type of the semiconductor regions.

First Embodiment

Figure 1:
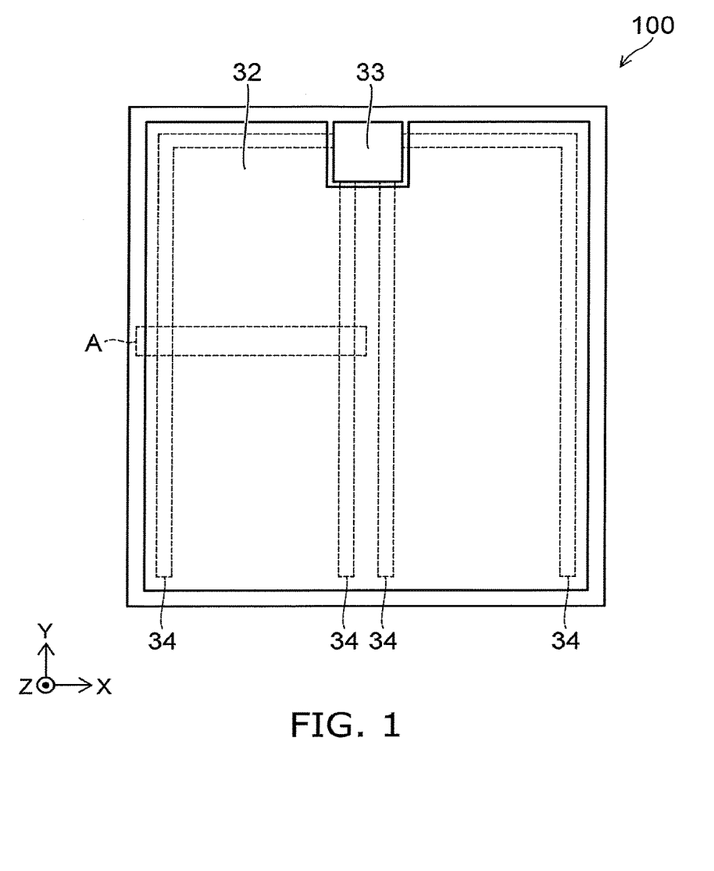
FIG. 1 is a plan view of a semiconductor device according to a first embodiment.

FIG. 1 is a plan view of a semiconductor device according to a first embodiment.

Figure 2:
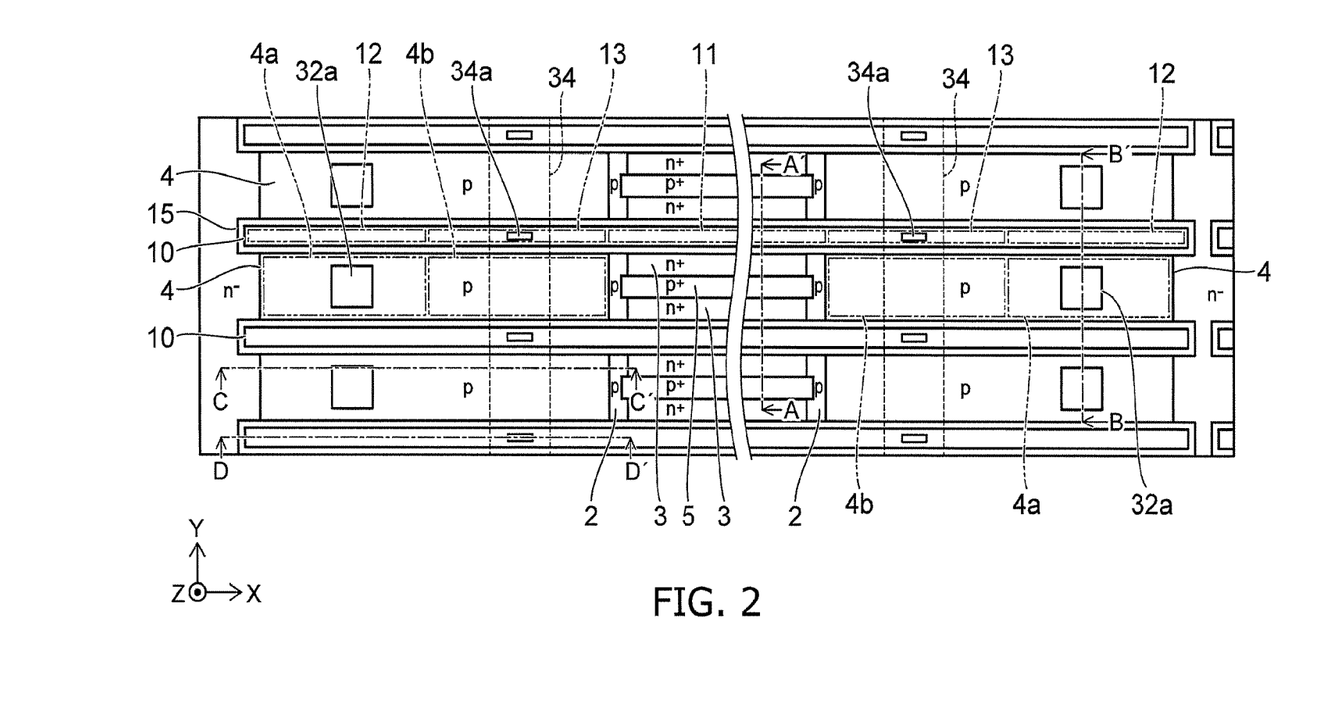
FIG. 2 is a plan view in which portion A of FIG. 1 is enlarged.

FIG. 2 is a plan view in which portion A of FIG. 1 is enlarged.

Figure 3A:
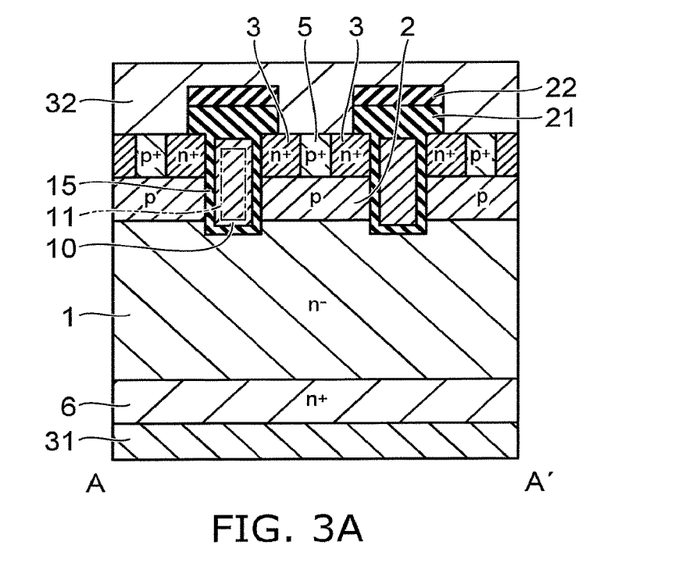
FIGS. 3A and 3B are an A-A' cross-sectional view and a B-B' cross-sectional view of FIG. 2.
Figure 3B:
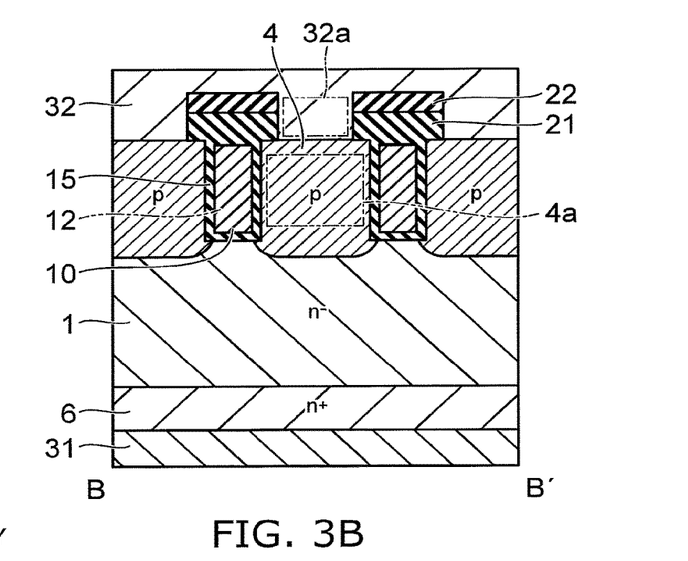

FIGS. 3A and 3B are an A-A' cross-sectional view and a B-B' cross-sectional view of FIG. 2.

Figure 4A:
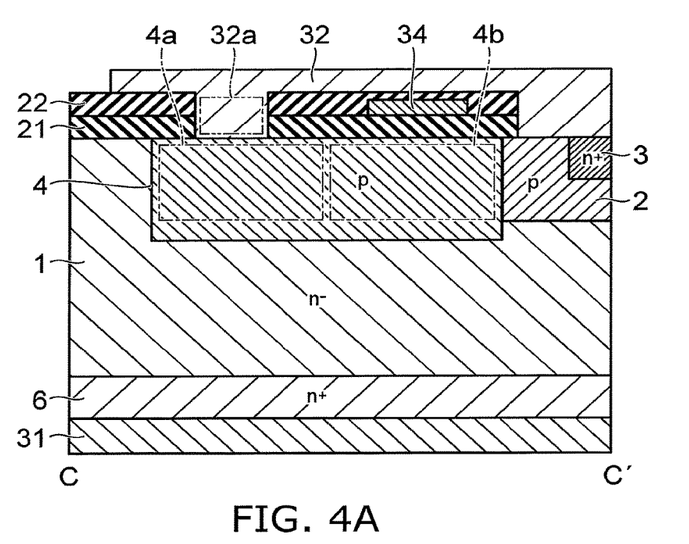
FIGS. 4A and 4B are a C-C' cross-sectional view and a D-D' cross-sectional view of FIG. 2.
Figure 4B:
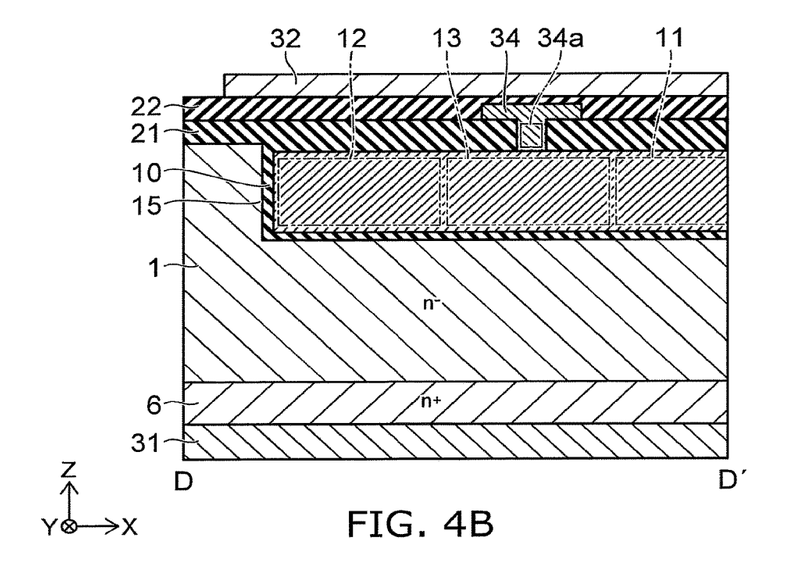

FIGS. 4A and 4B are a C-C' cross-sectional view and a D-D' cross-sectional view of FIG. 2.

An interconnect portion 34 is illustrated by broken lines in FIG. 1. To illustrate the planar structure of the semiconductor region in FIG. 2, some of the components of the semiconductor device 100 are not illustrated; and the interconnect portion 34 is illustrated by broken lines.

As illustrated in FIG. 1 to FIG. 4B, the semiconductor device 100 includes an $n^-$-type (first conductivity-type) drift region 1 (a first semiconductor region), a p-type (second conductivity-type) base region 2 (a second semiconductor region), an $n^+$-type source region 3 (a third semiconductor region), a p-type semiconductor region 4 (a fourth semiconductor region), a p+-type contact region 5 (a fifth semiconductor region), an n+-type drain region 6 (a sixth semiconductor region), a gate electrode 10, a gate insulating portion 15, an insulating layer 21, an insulating layer 22, a drain electrode 31 (a first electrode), a source electrode 32 (a second electrode), a gate pad 33 (a third electrode), and the interconnect portion 34.

An XYZ orthogonal coordinate system is used in the description of the embodiments. A direction from the p-type base region 2 toward the n+-type source region 3 is taken as a Z-direction (a first direction). Two mutually-orthogonal directions perpendicular to the Z-direction are taken as an X-direction (a third direction) and a Y-direction (a second direction). For the description, the direction from the n−-type drift region 1 toward the p-type base region 2 is called "up;" and the reverse direction is called "down." These directions are based on the relative positional relationship between the n−-type drift region 1 and the p-type base region 2 and are independent of the direction of gravity.

As illustrated in FIG. 1, the source electrode 32 and the gate pad 33 are provided on the upper surface of the semiconductor device 100 and are separated from each other. Multiple interconnect portions 34 are connected to the gate pad 33. For example, the multiple interconnect portions 34 are provided under the source electrode 32.

As illustrated in FIG. 2, the p-type base region 2, the n+-type source region 3, the p-type semiconductor region 4, the p+-type contact region 5, and the gate electrode 10 are provided under the source electrode 32 and the interconnect portions 34. The gate electrode 10 includes a first portion 11, a second portion 12, and a third portion 13.

The second portion 12 is separated from the first portion 11 in the X-direction. For example, the first portion 11 is positioned between a pair of second portions 12. The third portion 13 is positioned between the first portion 11 and the second portion 12 in the X-direction. The second portion 12 includes, for example, the end portion of the gate electrode 10 in the X-direction.

The p-type base region 2 and the n+-type source region 3 oppose the first portion 11 in the Y-direction with the gate insulating portion 15 interposed. For example, the p+-type contact region 5 is provided between the n+-type source regions 3 in the Y-direction.

The p-type semiconductor region 4 is arranged in the X-direction with the p-type base region 2, the n+-type source region 3, and the p+-type contact region 5. The p-type impurity concentration in the p-type semiconductor region 4 may be the same as or different from the p-type impurity concentration in the p-type base region 2. The p-type semiconductor region 4 includes a first region 4a and a second region 4b. The first region 4a opposes the second portion 12 in the Y-direction with the gate insulating portion 15 interposed. The second region 4b opposes the third portion 13 in the Y-direction with the gate insulating portion 15 interposed.

The interconnect portion 34 extends in the Y-direction on the multiple third portions 13 and on the multiple second regions 4b. As illustrated in FIG. 2 and FIG. 4B, contact portions 34a of the interconnect portion 34 are connected to the third portions 13. In other words, the multiple gate electrodes 10 are electrically connected to the interconnect portion 34 respectively via the contact portions 34a. The insulating layer is provided between the source electrode 32 and the interconnect portion 34. The source electrode 32 and the interconnect portion 34 are electrically isolated.

As illustrated in FIG. 3A, the drain electrode 31 is provided at the lower surface of the semiconductor device 100. The n+-type drain region 6 is provided on the drain electrode 31 and is electrically connected to the drain electrode 31.

The n−-type drift region 1 is provided on the n+-type drain region 6.

As illustrated in FIG. 3A and FIG. 3B, the p-type base region 2, the p-type semiconductor region 4, and the gate electrode 10 are provided on the n−-type drift region 1. The n+-type source region 3 and the p+-type contact region 5 are provided on the p-type base region 2. The source electrode 32 is positioned on the p-type base region 2, the n+-type source region 3, the first region 4a, and the p+-type contact region 5 and is electrically connected to these regions. The insulating layer 21 and the insulating layer 22 are provided on the gate electrode 10. The gate electrode 10 and the source electrode 32 are electrically isolated.

For example, the lower end of the p-type semiconductor region 4 is positioned lower than the lower end of the p-type base region 2. In other words, the p-n junction surface between the n−-type drift region 1 and the p-type semiconductor region 4 is positioned lower than the p-n junction surface between the n−-type drift region 1 and the p-type base region 2.

As illustrated in FIG. 4A, the first region 4a is connected to a contact portion 32a of the source electrode 32. As illustrated in FIG. 2, the multiple first regions 4a are electrically connected to the source electrode 32 respectively via the contact portions 32a.

Operations of the semiconductor device 100 will now be described.

When a voltage that is a threshold or more is applied to the gate electrode 10 in a state in which a voltage that is positive with respect to the source electrode 32 is applied to the drain electrode 31, a channel (an inversion layer) is formed at the gate insulating portion 15 vicinity of the p-type base region 2; and the semiconductor device 100 is set to an on-state. Electrons pass through the channel and flow from the source electrode 32 toward the drain electrode 31. Subsequently, when the voltage that is applied to the gate electrode 10 becomes lower than the threshold, the channel in the p-type base region 2 disappears; and the semiconductor device 100 is set to an off-state.

When the semiconductor device 100 is switched from the on-state to the off-state, a large voltage (an induced electromotive force) with respect to the source electrode 32 is applied temporarily to the drain electrode 31 due to the capacitance component of the circuit to which the semiconductor device 100 is connected. At this time, avalanche breakdown occurs; and electrons and holes are generated in the interior of the semiconductor device 100. The holes that are generated flow toward the source electrode 32; and the electrons flow toward the drain electrode 31.

Examples of the materials of the components of the semiconductor device 100 will now be described.

The n−-type drift region 1, the p-type base region 2, the n+-type source region 3, the p-type semiconductor region 4, the p+-type contact region 5, and the n+-type drain region 6 include silicon, silicon carbide, gallium nitride, or gallium arsenide as a semiconductor material. In the case where silicon is used as the semiconductor material, arsenic, phosphorus, or antimony may be used as the n-type impurity. Boron may be used as the p-type impurity.

The gate electrode 10 includes a conductive material such as polysilicon, etc.

The gate insulating portion 15, the insulating layer 21, and the insulating layer 22 include an insulating material such as silicon oxide, etc.

The drain electrode 31 and the source electrode 32 include a metal such as aluminum, etc.

Effects of the first embodiment will now be described.

In the semiconductor device 100, the second portion 12 and the third portion 13 of the gate electrode 10 oppose the p-type semiconductor region 4 with the gate insulating portion 15 interposed. According to this configuration, a capacitance $C_{GD}$ between the gate electrode 10 and the drain electrode 31 can be reduced compared to the case where the second portion 12 and the third portion 13 oppose the n-type semiconductor region (e.g., a portion of the n⁻-type drift region 1) with the gate insulating portion 15 interposed. By reducing the capacitance $C_{GD}$, the time (the switching time) from when the voltage that is the threshold or more is applied to the gate electrode 10 until the semiconductor device 100 is switched to the on-state can be short. Thereby, the switching loss of the semiconductor device 100 can be reduced.

On the other hand, when switching the semiconductor device 100 to the off-state in the case where the second portion 12 and the third portion 13 oppose the p-type semiconductor region 4, holes that are generated at the outer perimeter portion of the n⁻-type drift region 1 flow toward the p-type semiconductor region 4. In the case where the p-type semiconductor region 4 is not directly connected to the source electrode 32, the holes that flow toward the p-type semiconductor region 4 pass through the p-type base region 2 and the p⁺-type contact region 5 and are discharged to the source electrode 32. In such a case, the amount of the holes stored in the p-type semiconductor region 4 increases; and the potential of the p-type semiconductor region 4 increases. When the potential of the p-type semiconductor region 4 increases, the potential difference between the p-type semiconductor region 4 and the gate electrode 10 becomes large. When this potential difference becomes large, there is a possibility that dielectric breakdown of the gate insulating portion 15 may occur; and the p-type semiconductor region 4 and the gate electrode 10 may be shorted.

In the semiconductor device 100 according to the first embodiment, the source electrode 32 is provided not only on the n⁺-type source region 3 and the p⁺-type contact region 5 but also on the first region 4a of the p-type semiconductor region 4 and is connected to the p-type semiconductor region 4. By connecting the source electrode 32 to the p-type semiconductor region 4, the holes that flow toward the p-type semiconductor region 4 are discharged efficiently to the source electrode 32. The amount of the holes stored in the p-type semiconductor region 4 decreases.

The source electrode 32 is connected not to the second region 4b but to the first region 4a. The first region 4a is positioned further on the end portion side of the gate electrode 10 than is the third portion 13. According to this configuration, the amount of the holes stored in the p-type semiconductor region 4 can be reduced further. Thereby, even in the case where the p-type semiconductor region 4 is provided, the increase of the potential of the p-type semiconductor region 4 can be suppressed. The likelihood of the p-type semiconductor region 4 and the gate electrode 10 shorting can be reduced. Accordingly, according to the embodiment, the likelihood of the p-type semiconductor region 4 and the gate electrode 10 shorting can be reduced while reducing the capacitance $C_{GD}$.

In the example illustrated in FIG. 2 to FIG. 4B, the p-type semiconductor region 4 includes the second region 4b opposing the third portion 13 in the Y-direction with the gate insulating portion 15 interposed. The p-type semiconductor region 4 may not include the second region 4b. The third portion 13 may oppose a portion of the n⁻-type drift region 1 in the Y-direction with the gate insulating portion 15 interposed. Even in such a case, because the first region 4a of the p-type semiconductor region 4 and the second portion 12 of the gate electrode 10 oppose each other, the capacitance $C_{GD}$ can be reduced compared to the case where the second portion 12 and a portion of the n⁻-type drift region 1 oppose each other. However, to reduce the capacitance $C_{GD}$ further, it is desirable for the p-type semiconductor region 4 to include the second region 4b as illustrated in FIG. 2 to FIG. 4B.

As illustrated in FIG. 4A, it is desirable for the lower end of the p-type semiconductor region 4 to be positioned lower than the lower end of the p-type base region 2. According to this configuration, the surface area of the first region 4a opposing the second portion 12 can be increased; and the surface area of the second region 4b opposing the third portion 13 can be increased. Thereby, the capacitance $C_{GD}$ can be reduced further.

Modification

Figure 5:
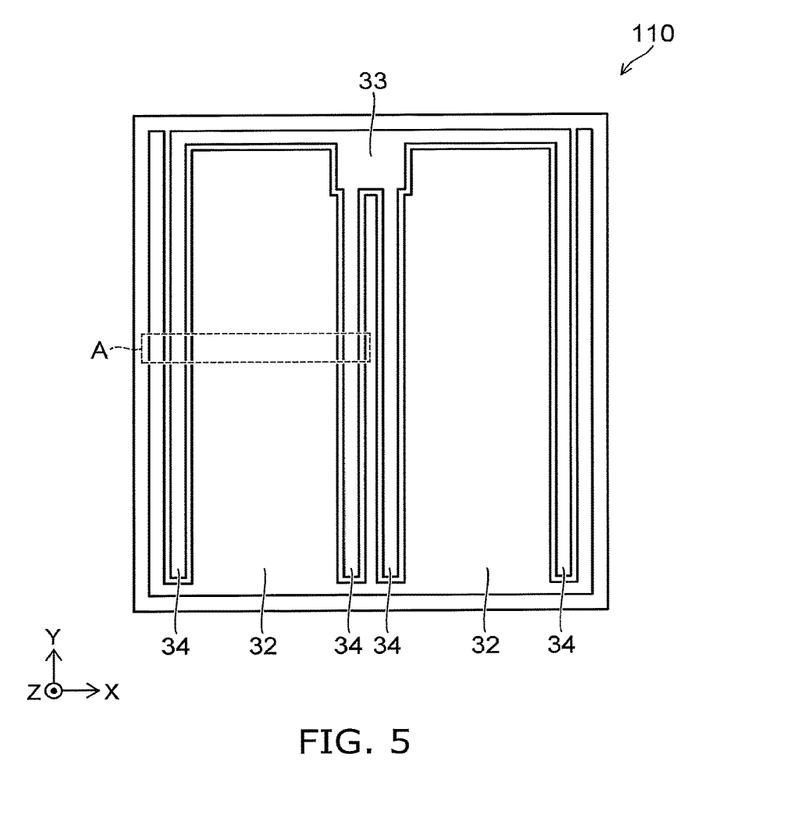
FIG. 5 is a plan view of a semiconductor device according to a modification of the first embodiment.

FIG. 5 is a plan view of a semiconductor device according to a modification of the first embodiment.

Figure 6:
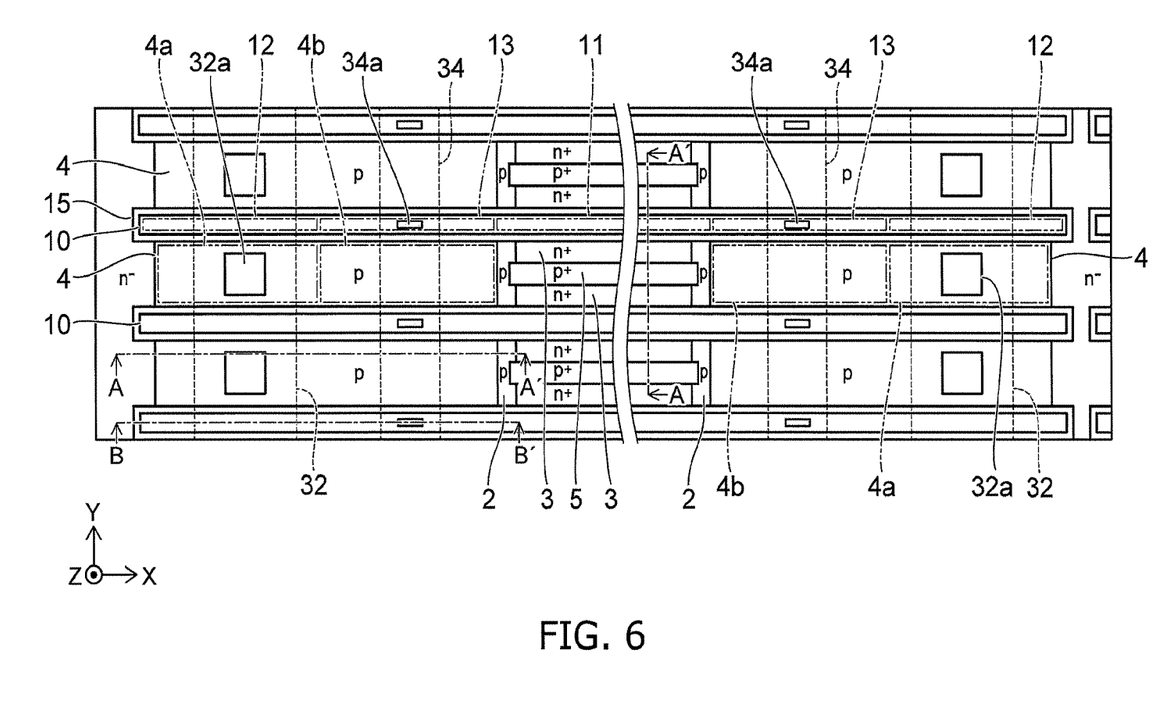
FIG. 6 is a plan view in which portion A of FIG. 5 is enlarged.

FIG. 6 is a plan view in which portion A of FIG. 5 is enlarged.

Figure 7A:
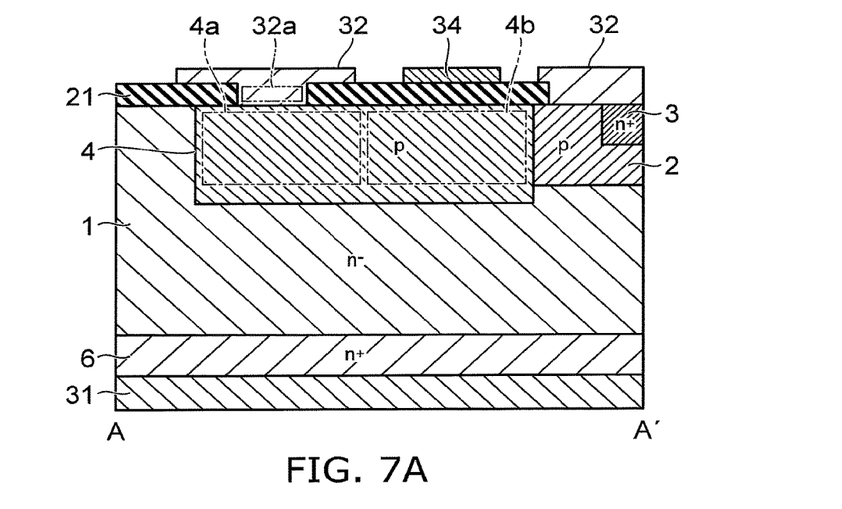
FIGS. 7A and 7B are an A-A' cross-sectional view and a B-B' cross-sectional view of FIG. 5.
Figure 7B:
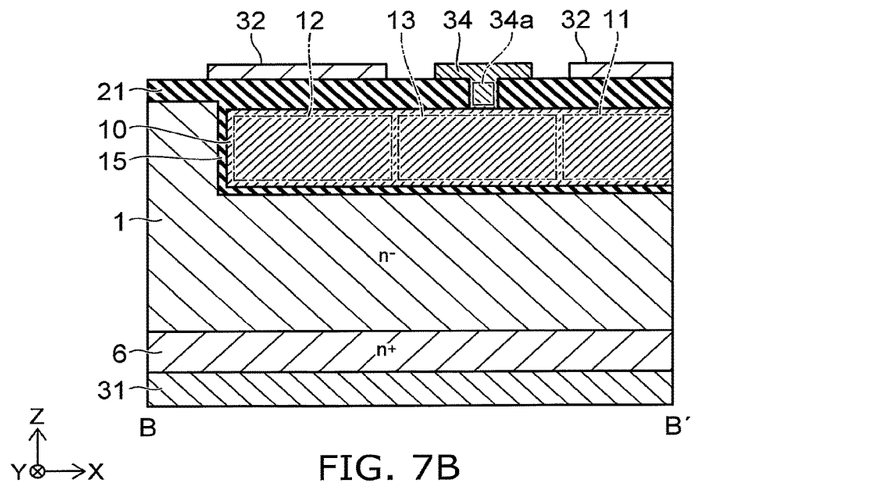

FIGS. 7A and 7B are an A-A' cross-sectional view and a B-B' cross-sectional view of FIG. 5.

To illustrate the planar structure of the semiconductor region, some of the components of the semiconductor device 110 are not illustrated in FIG. 6. The source electrode 32 and the interconnect portion 34 are illustrated by broken lines.

In the semiconductor device 100 illustrated in FIG. 1 to FIG. 4B, the interconnect portion 34 is provided under the source electrode 32. In the semiconductor device 110 according to the modification illustrated in FIG. 5, the source electrode 32 and the interconnect portion 34 are provided in the same plane and are separated from each other. For example, the multiple interconnect portions 34 and portions of the source electrode 32 are provided alternately in the X-direction.

As illustrated in FIG. 6 to FIG. 7B, a portion of the source electrode 32 extends in the Y-direction above the multiple first regions 4a and above the multiple second portions 12. The source electrode 32 is connected to the first regions 4a at the contact portions 32a. The interconnect portion 34 extends in the Y-direction above the multiple second regions 4b and above the multiple third portions 13. The interconnect portion 34 is connected to the third portions 13 at the contact portions 34a.

In the semiconductor device 110 according to the modification as well, similarly to the semiconductor device 100, the likelihood of the p-type semiconductor region 4 and the gate electrode 10 shorting can be reduced while reducing the capacitance $C_{GD}$. Thus, as long as the first region 4a and the source electrode 32 can be connected and the third portion 13 and the interconnect portion 34 can be connected, the configurations of the source electrode 32 and the interconnect portion 34 are modifiable as appropriate.

As in the modification, the manufacturing of the semiconductor device 110 is easy by providing the source electrode 32 and the interconnect portion 34 in the same plane. Thereby, for example, the yield can be increased. On the other hand, according to the semiconductor device 100, the effective region that operates as a MOSFET can be wide compared to the semiconductor device 110 because the interconnect portion 34 is stacked with the source electrode 32 with the insulating layer 22 interposed.

Second Embodiment

Figure 8:
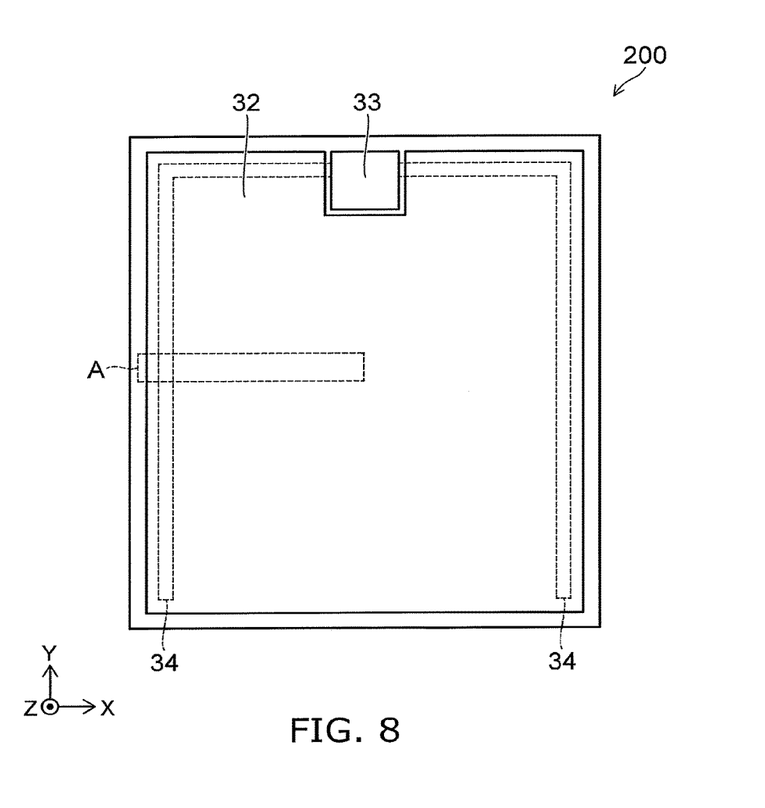
FIG. 8 is a plan view of a semiconductor device according to a second embodiment.

FIG. 8 is a plan view of a semiconductor device according to a second embodiment.

Figure 9:
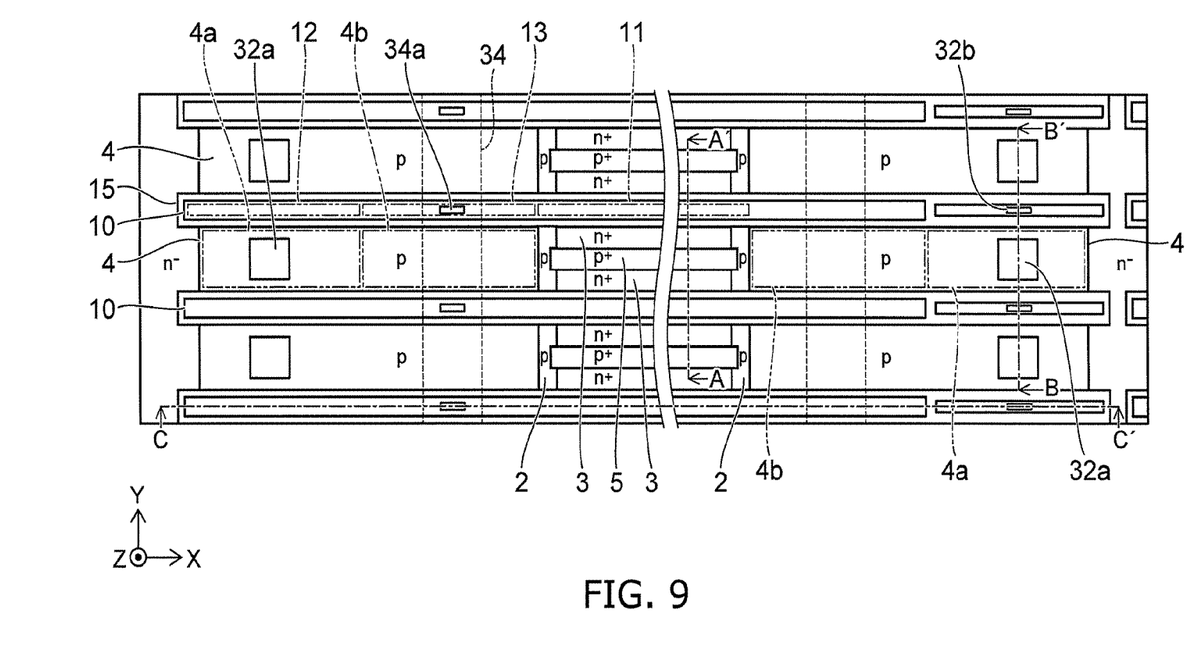
FIG. 9 is a plan view in which portion A of FIG. 8 is enlarged.

FIG. 9 is a plan view in which portion A of FIG. 8 is enlarged.

Figure 10A:
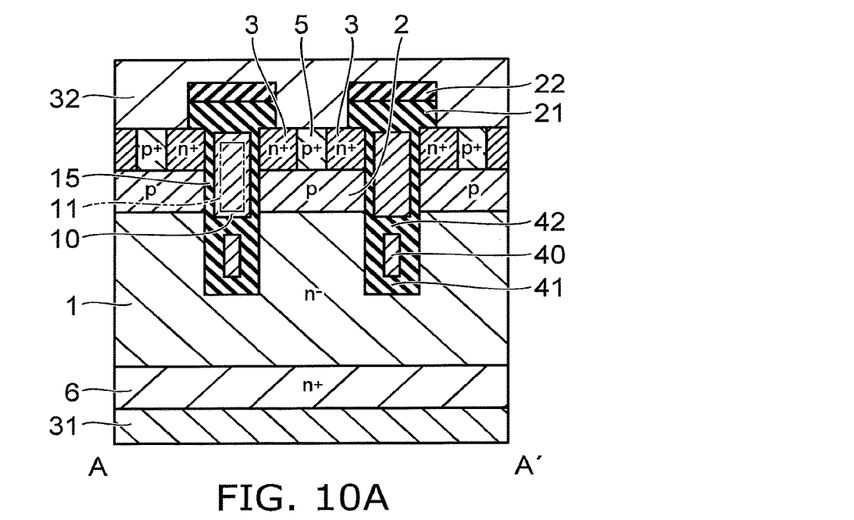
FIGS. 10A and 10B are an A-A' cross-sectional view and a B-B' cross-sectional view of FIG. 9.
Figure 10B:
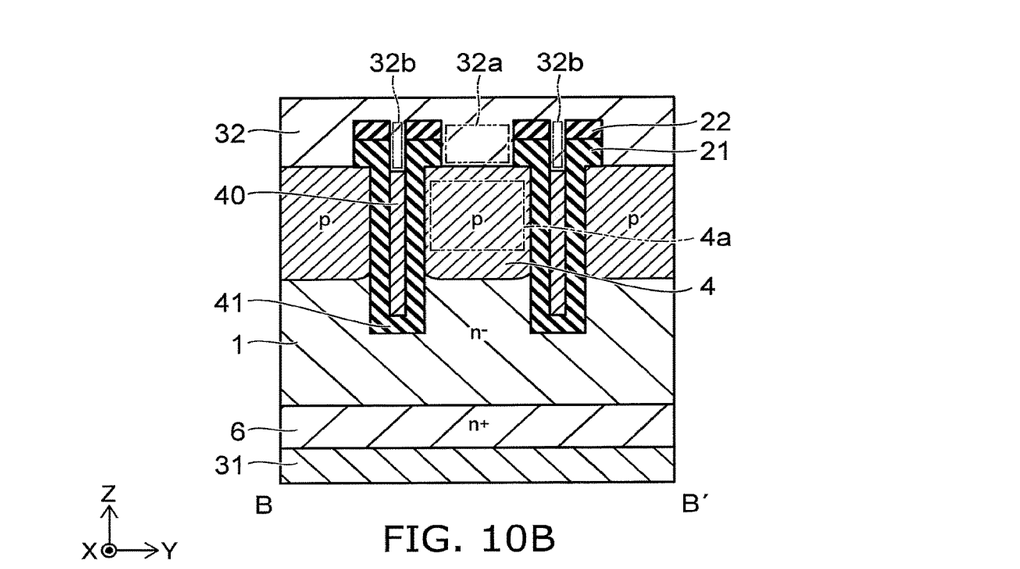

FIGS. 10A and 10B are an A-A' cross-sectional view and a B-B' cross-sectional view of FIG. 9.

Figure 11:
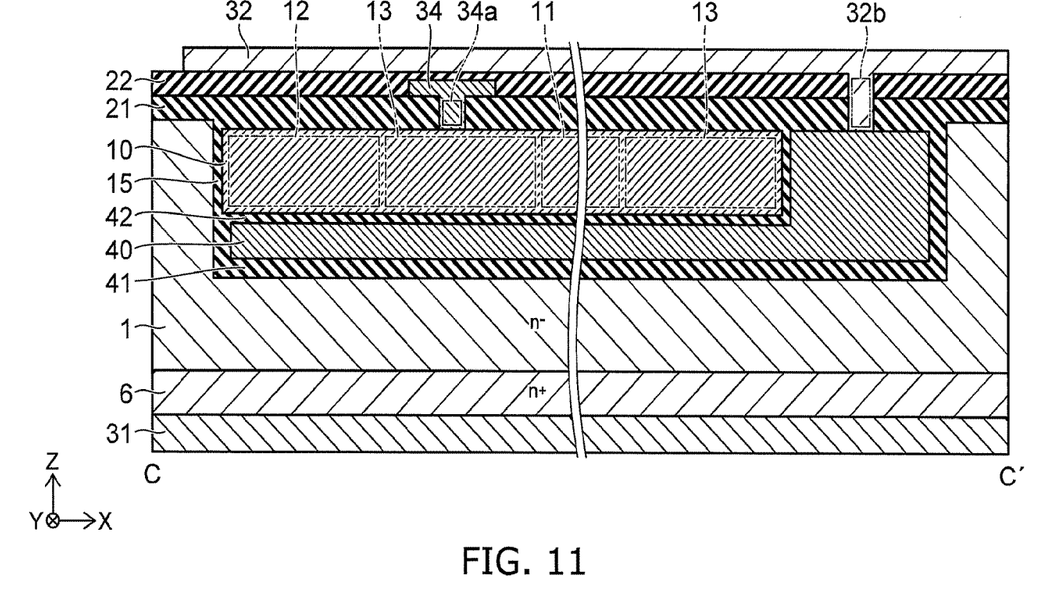
FIG. 11 is a C-C' cross-sectional view of FIG. 9.

FIG. 11 is a C-C' cross-sectional view of FIG. 9.

In FIG. 9, some of the components of the semiconductor device are not illustrated; and the interconnect portion 34 is illustrated by broken lines.

The semiconductor device 200 according to the second embodiment further includes a conductive portion 40, a first insulating portion 41, and a second insulating portion 42. As illustrated in FIG. 10A to FIG. 11, the conductive portion 40 is provided inside the n⁻-type drift region 1 with the first insulating portion 41 interposed. The gate electrode 10 is provided on the conductive portion 40 with the second insulating portion 42 interposed. As illustrated in FIG. 11, the conductive portion 40 is connected to a contact portion 32b of the source electrode 32. The conductive portion 40 may be electrically connected to the gate pad 33.

For example, as illustrated in FIG. 9, the gate electrode 10 is connected to the contact portion 34a of the interconnect portion 34 at one end portion in the X-direction. The conductive portion 40 is connected to the contact portion 32b of the source electrode 32 at the end portion on the opposite side. For example, the multiple contact portions 32b and portions of the multiple contact portions 32a are arranged in the Y-direction.

In the case where the conductive portion 40 is provided, when the semiconductor device 200 is turned off, a depletion layer spreads toward the n⁻-type drift region 1 from the boundary between the first insulating portion 41 and the n⁻-type drift region 1. Thereby, the breakdown voltage of the semiconductor device 200 can be increased.

On the other hand, in the case where the conductive portion 40 is provided, the n⁻-type drift region 1 depletes in a shorter time compared to the semiconductor device 100. Therefore, when switching the semiconductor device 200 to the off-state, the voltage of the drain electrode 31 increases in a shorter time compared to the semiconductor device 100. As a result, the induced electromotive force that is applied to the drain electrode 31 also increases; and more carriers are generated in the avalanche state.

When more carriers are generated, the potential of the p-type semiconductor region 4 increases more easily when the holes are discharged to the source electrode 32. In the semiconductor device 200, the source electrode 32 is connected to the first region 4a of the p-type semiconductor region 4. Even in the case where the conductive portion 40 is provided, the increase of the potential of the p-type semiconductor region 4 can be suppressed. In other words, according to the embodiment, the likelihood of the p-type semiconductor region 4 and the gate electrode 10 shorting can be reduced while reducing the capacitance $C_{GD}$ and increasing the breakdown voltage.

In each of the embodiments described above, it is possible to confirm the relative levels of the impurity concentrations between the semiconductor regions by using, for example, a SCM (scanning capacitance microscope). The carrier concentration in each semiconductor region can be considered to be equal to the activated impurity concentration in each semiconductor region. Accordingly, the relative levels of the carrier concentrations between the semiconductor regions also can be confirmed using SCM.

It is possible to measure the impurity concentration in each semiconductor region by, for example, SIMS (secondary ion mass spectrometry).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a first electrode;
a first semiconductor region provided on the first electrode and electrically connected to the first electrode, the first semiconductor region being of a first conductivity type;
a second semiconductor region provided on the first semiconductor region, the second semiconductor region being of a second conductivity type;
a third semiconductor region provided on a portion of the second semiconductor region, the third semiconductor region being of the first conductivity type;
a gate electrode provided on the first semiconductor region, the gate electrode including
a first portion, the first portion opposing, in a second direction with a gate insulating portion interposed, the second semiconductor region, a portion of the first semiconductor region, and at least a portion of the third semiconductor region, the second direction being perpendicular to a first direction, the first direction being from the first semiconductor region toward the second semiconductor region,
a second portion separated from the first portion in a third direction, the third direction being perpendicular to the first direction and the second direction, and
a third portion positioned between the first portion and the second portion,
a fourth semiconductor region including a first region and being of the second conductivity type, the first region opposing the second portion in the second direction with the gate insulating portion interposed;
an interconnect portion provided on the third portion and electrically connected to the third portion; and
a second electrode provided on the second semiconductor region, the third semiconductor region, and the first region, the second electrode being electrically connected to the second semiconductor region, the third semiconductor region, and the fourth semiconductor region and electrically isolated from the interconnect portion.

2. The device according to claim 1, wherein
the fourth semiconductor region further includes a second region, and
the second region opposes the third portion in the second direction with the gate insulating portion interposed.

3. The device according to claim 1, wherein a lower end of the fourth semiconductor region is positioned lower than a lower end of the second semiconductor region.

4. The device according to claim 1, further comprising a third electrode separated from the second electrode and electrically connected to the interconnect portion.

5. The device according to claim 1, further comprising a conductive portion provided inside the first semiconductor region with a first insulating portion interposed,
   the gate electrode being provided on the conductive portion with a second insulating portion interposed,
   the conductive portion being electrically connected to the second electrode or the gate electrode.

6. The device according to claim 1, comprising a plurality of the gate electrodes,
   the plurality of gate electrodes being arranged in the second direction,
   the interconnect portion being provided on a plurality of the third portions and electrically connected to the plurality of third portions.

7. The device according to claim 6, comprising a plurality of the fourth semiconductor regions,
   a plurality of the first regions respectively opposing, in the second direction with the gate insulating portion interposed, a plurality of the second portions,
   the second electrode being provided on the plurality of first regions and electrically connected to the plurality of first regions.

8. The device according to claim 1, wherein a portion of the second electrode is provided on the interconnect portion with an insulating layer interposed.

9. The device according to claim 1, wherein at least a portion of the interconnect portion is provided between a portion of the second electrode and another portion of the second electrode in a direction perpendicular to the first direction.

* * * * *